United States Patent [19]
Baker et al.

[11] B 3,993,934
[45] Nov. 23, 1976

[54] INTEGRATED CIRCUIT STRUCTURE HAVING A PLURALITY OF SEPARABLE CIRCUITS

[75] Inventors: Theodore H. Baker; Majid Ghafghaichi; Richard C. Stevens, all of Poughkeepsie; Daniel Tuman, Beacon, all of N.Y.

[73] Assignee: IBM Corporation, Armonk, N.Y.

[22] Filed: Nov. 30, 1973

[21] Appl. No.: 420,472

[44] Published under the second Trial Voluntary Protest Program on February 24, 1976 as document No. B 420,472.

Related U.S. Application Data

[62] Division of Ser. No. 364,791, May 29, 1973, Pat. No. 3,801,905, which is a division of Ser. No. 129,500, March 30, 1971.

[52] U.S. Cl. ............................... 317/101 A; 29/574
[51] Int. Cl.² .......................................... H01L 19/00
[58] Field of Search ................... 317/101 A; 29/574; 324/51; 357/40, 46

[56] References Cited
UNITED STATES PATENTS

| 3,303,400 | 2/1967 | Allison | 317/101 A |
| 3,539,876 | 11/1970 | Feinberg et al. | 317/101 A |
| 3,553,830 | 1/1971 | Jenny et al. | 317/101 A |
| 3,689,803 | 9/1972 | Baker et al. | 317/101 A |

*Primary Examiner*—David Smith, Jr.
*Attorney, Agent, or Firm*—J. B. Kraft

[57] ABSTRACT

A method for determining whether an integrated circuit chip containing a plurality of separable circuits is operable when one or more of the separable circuits is not functional.

A chip including a plurality of discrete or separable circuits, each of which include means for selectively receiving and distributing a voltage level necessary to render the particular circuit operable, the chip further including a region of one type conductivity at said voltage level common to all of the discrete circuits is tested by a method which will insure that short-circuits between a particular circuit found not to be functional and therefore not to be rendered operable and the common region will not inadvertently apply the voltage level from the common region to voltage receiving and distribution means in the non-functional circuit.

All the discrete circuits are first tested to determine which are functional. Then those circuits which fail the functionality test are tested further to detect whether any of these failed circuits have electrical short-circuits between the common region and the means for receiving and distributing said operable voltage level in the failed circuit. If any of the failed circuits have such a short, the chip is considered to be inoperative because such a short will inadvertently connect the failed circuit with the functional circuits.

4 Claims, 4 Drawing Figures

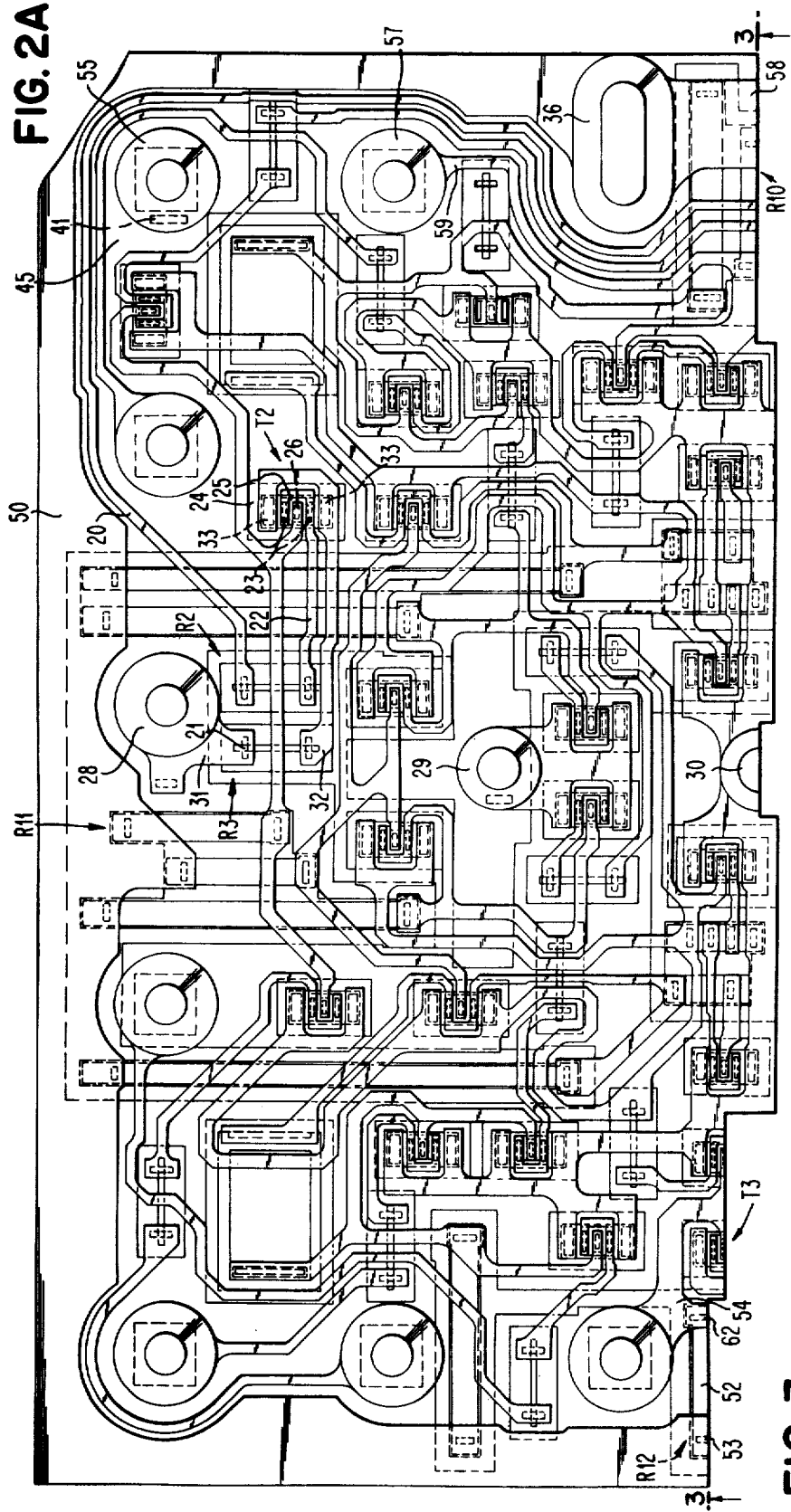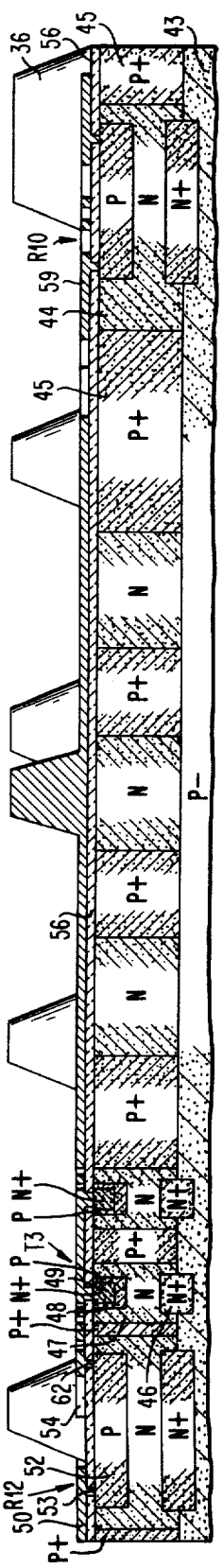

INTEGRATED CIRCUIT STRUCTURE HAVING A PLURALITY OF SEPARABLE CIRCUITS

This is a division of application Ser. No. 364,791, now U.S. Pat. No. 3,801,905, filed May 29, 1973, which was a divisional of prior parent application Ser. No. 129,500, filed on Mar. 30, 1971.

BACKGROUND OF THE INVENTION

The present invention relates to monolithic semiconductor integrated circuit structures and particularly to such structures which contain a plurality of separable circuits one or more of which may be selectively rendered operable if such circuits meet specified functionality criteria.

With the ever-increasing micro-miniaturization of integrated semiconductor circuits and the attendant increased density of such circuits, the unit cost per chip is increasing at a very rapid pace. In addition, the likelihood of processing defects rendering the chip circuit inoperative has been greatly increased. Consequently, with the advance of large scale integration, low yields have been a problem in the fabrication of semiconductor integrated circuits. Because of this problem, the art has been seeking structures and methods wherein a defect in one portion of the chip is not necessarily fatal to the whole chip, and the undamaged portion of the chip circuits may be salvaged and used. One such approach involves arranging the devices on the chip into a plurality of discrete and separable circuits. Each of these circuits occupies a given position on the chip. With this arrangement, the aim is to be able to utilize the separable circuits without defects in the case where a defect on the chip renders one or more of the circuits inoperative.

In providing such discrete and separable circuits, we have found that it is not very practical from a fabrication view to attempt to form a structure in which the discrete circuits are completely and totally isolated from each other, i.e. they have no region or metallization in common. It is much more practical to utilize chip structures in which the discrete circuits have some regions in common such as the chip substrate on which the epitaxial layer is formed, the isolation region or the body of the epitaxial layer proper. Likewise, some of the metallization, such as metallization from one or more of the voltage supplies has to be common to some of the discrete circuits in order to obtain maximum utilization of the surface area of the chip. However, in such chip structures, we are confronted with the problem of insuring that the common regions or common metallization shared by the functional and non-functional separable circuits does not affect the performance of the functional circuits during the selective use of such functional circuits during the operation of the chip.

SUMMARY OF THE INVENTION

Accordingly, the primary object of the present invention is to provide a method of testing for the functionality of a plurality of discrete circuits in an integrated semiconductor circuit chip structure which insures that the defective discrete circuits will not render otherwise good discrete circuits inoperative.

Another object of the present invention is to provide a method of testing for the functionality of chips having a plurality of discrete circuits wherein said discrete circuits include common regions, which testing method determines the effects of the defective circuits on otherwise good circuits.

It is a further object of the present invention to provide a method of testing integrated circuit chips containing a plurality discrete and separable circuits having regions in common which detects the defective circuits and then determines whether such defects will influence the circuits having no defects.

It is yet another object of the present invention to provide a method of testing with respect to the previous object which will determine whether the influence of the defects in the bad circuits are sufficient to render the good circuits inoperative.

The present invention is directed to a method of testing for the functionality of integrated circuit chips having a plurality of discrete and separable circuits. Although the circuits are separable, they usually share common regions of selected conductivity types as well as common metallizations. For example, the conventional integrated circuit chip comprises a substrate of one conductivity type and an epitaxial layer of another conductivity type on said substrate. Isolation regions of said one conductivity type extend through the epitaxial layer to said substrate to form isolation enclosures in combination with said substrates. Thus, in all integrated circuit chips of the type described, either the isolation region or the epitaxial body proper will be common to all portions of the chip and extend to all portions of said chip.

The discrete or separable circuits in the chip, each require the application of a plurality of voltage levels in order to be rendered operable. As will be explained hereinafter in greater detail, only those circuits on the chip found to be functional are rendered operable when the chip is mounted on its ceramic supporting module. This is accomplished by the inclusion in each of the circuit means, such as a metallization pattern for selectively and independently receiving and distributing one of said voltage supplies. The remainder of said plurality of voltage supplies are applied to all of said separable circuits. Thus, only the circuits found to be functional (good circuits) will have applied thereto all of the voltage supplies necessary to render the circuit operable. Said one voltage supply will not be selectively applied to those separable circuits found to be non-functional (bad circuits).

In testing to determine the operability of the circuits in the chip, all the discrete circuits are first subject to conventional basic performance tests which are well-known in the art to determine whether or not the circuits can perform basic function for which they were designed. These basic performance or functional tests determine which discrete circuits on the chip are "good" and which are "bad". Next, there must be performed a test which will determine whether any of the bad circuits on the chip will render the entire chip inoperative. Since the plurality of voltage supplies applied to each of the circuits are in effect applied to the regions within said circuits, the one voltage supply which is selectively applied to only the good circuits is applied, among other regions, to a region in the good circuit which is common to the bad circuit. Thus, each of the bad circuits will have one region, the common region, at said one voltage level. However, since said one voltage level necessary to render the circuit operable, will not be applied to the receiving and distributing means in said bad circuits, said one voltage level will not be distributed to all of the other regions in the bad circuits necessary to render the circuits operable. On the other hand, if in the bad circuit, there is a short between the common region which is at said one voltage level and the means, usually metallization pattern, in said bad circuit for receiving and distributing said one voltage level, the bad circuit will be rendered operable, and the remainder of the good circuits in the chip will be adversely affected and probably rendered inoperative.

In the present method, each of the bad circuits are tested to insure that there is no short-circuit in such bad circuits between the common region at said one voltage level and the means for receiving and distributing said one voltage level in the bad circuits.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 2A is a more detailed view of the upper half of the planar surface of FIG. 1 showing one of said A.C. trigger circuits.

FIG. 3 is a cross-sectional view taken along line 3—3 of FIG. 2A.

DESCRIPTION OF PREFERRED EMBODIMENTS

Figure 1:
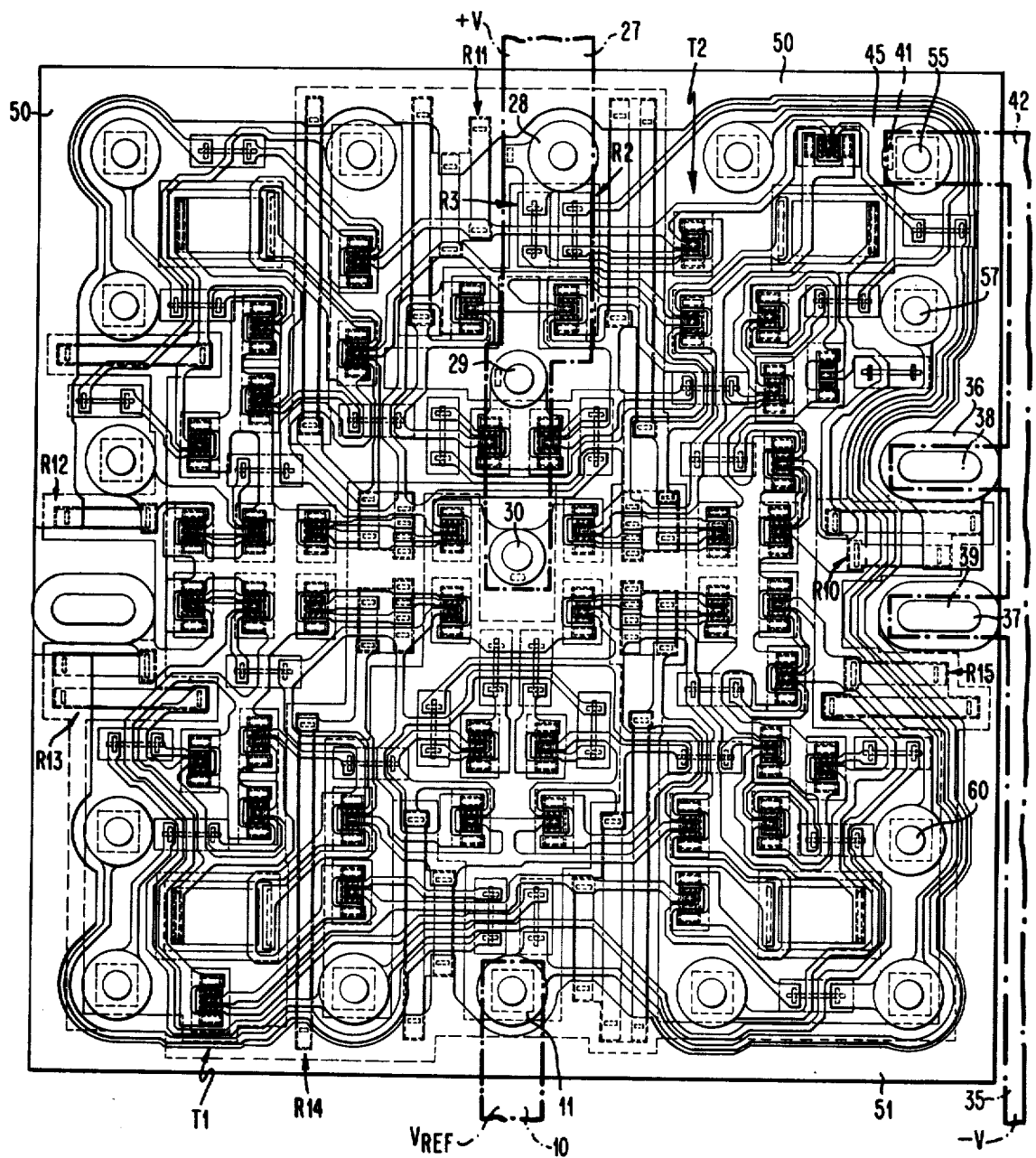
FIG. 1 is a top view of the planar surface of an integrated circuit chip having a pair of separable A.C. trigger circuits which is to be tested in accordance with the method of the present invention. The figure shows both the metallization pattern on the chip and the diffused regions forming the active and passive devices in each of the separable circuits. There is also shown in phantom lines the metallization or lands on the surface of the module (not shown) whereby the three voltage supplies of different levels are applied to pads in the chip.

FIG. 1 is a top view of an integrated circuit chip which has a pair of discrete and separable circuits, A.C. trigger circuits. An appreciation of the structure of this chip should help to understand the problems to which the present method of testing is directed. In FIG. 1, the metallization pattern is shown as well as all the diffused regions which extend from the planar surface of the chip. The regions in the chip are preferably formed by diffusion using conventional techniques, and the insulative layer over the planar surface as well as the metallization pattern on the insulative layer may be applied in the conventional manner. The integrated circuit chip is fabricated in accordance with the method described in U.S. Pat. No. 3,539,876. The metallization pattern on the planar surface of the chip is separated from the chip proper by a layer of insulative material, such as silicon dioxide. As will be illustrated hereinafter, the metallization pattern is selectively joined to regions of a chip proper through electrical contacts passing through openings or holes in the insulative layer. In addition to interconnecting various regions in the devices in the chip, the metallization pattern serves to distribute voltage levels from three different voltage supplies throughout the chip.

The chip is to be seated on a printed land pattern, corresponding to the pad positions on the chip located on the surface of the ceramic module which is not shown. The chip is seated on the module in the manner shown and described in U.S. Pat. No. 3,539,876 (FIGS. 18 and 19). The pads may be connected to the lands and the ceramic substrates in the manner described in U.S. Pat. 3,429,040.

Figure 2B:
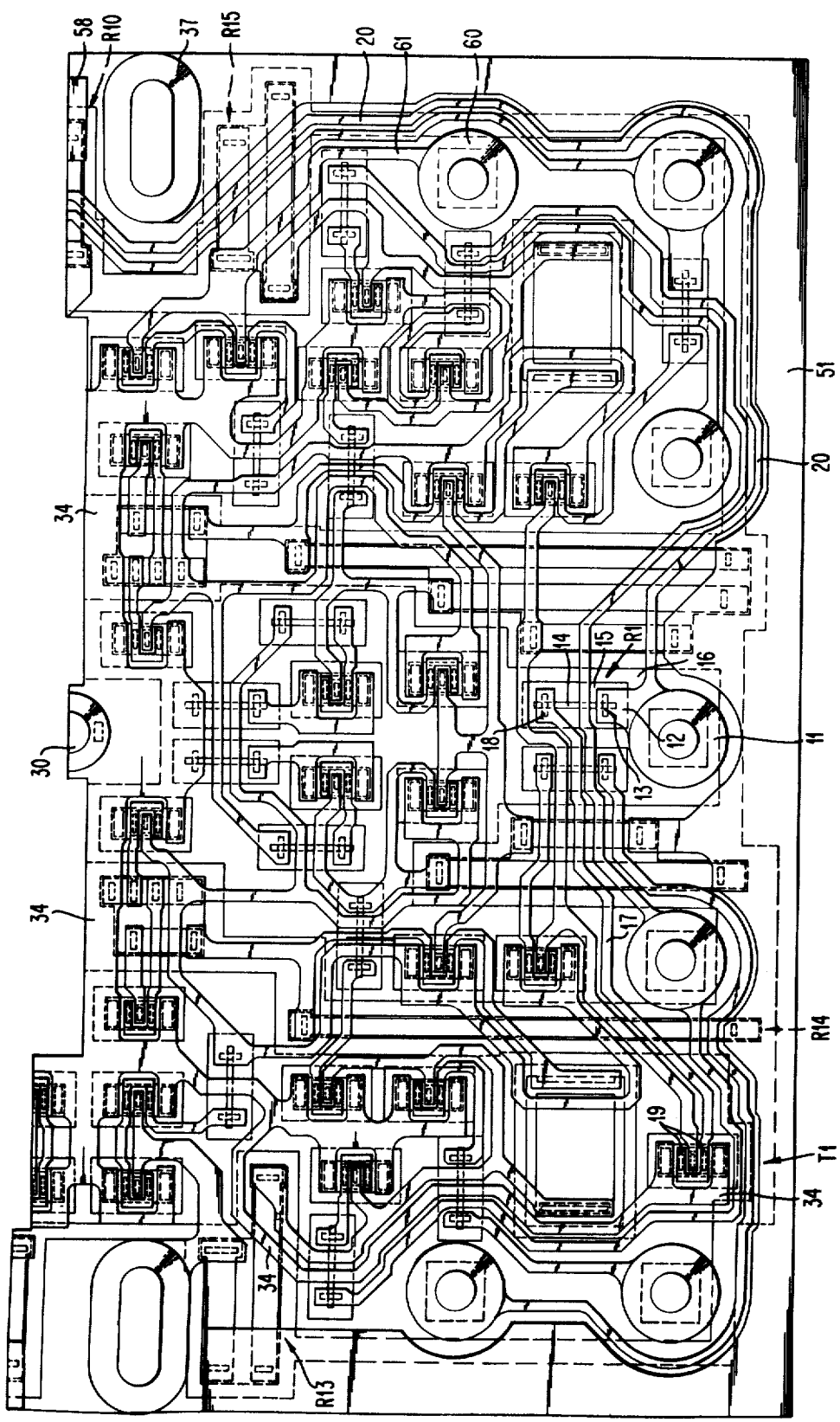
FIG. 2B is a more detailed view of the lower half of the planar surface of FIG. 1 showing the other of said A.C. trigger circuits.

The three voltage supplies applied to the chip have been labeled as $V_{Ref}$, +V, and −V. They are applied through lands on the surface of the ceramic module which is not shown. The lands on the module providing the voltage supplies are shown in FIG. 1 as phantom lines. Land 10 applies to $V_{Ref}$ voltage supply to pad 11 on the chip. The $V_{Ref}$ supply applied to pad 11 is applied to both of the A.C. trigger circuits which respectively occupy the upper and lower halves of the chip. For convenience. the diffused devices in the upper half of the chip may be considered to form one A.C. trigger while the devices in the lower half of the chip form the other A.C. trigger circuit. With reference to FIGS. 1 and 2B, the $V_{Ref}$ supply pad 11 is distributed to the lower A.C. trigger as follows: metallization segment 12 via contact 13 to underpass resistor R1 which comprises N+ underpass diffusion 14 in N bed 15 surrounded by P+ isolation 16. Underpass resistor R1 is connected to metallization line 17 through contact 18. Line 17 is connected to the base region of transistor T1 through contacts 19. With reference to FIGS. 1 and 2A, the $V_{Ref}$ voltage supply from pad 11 is connected to the upper A.C. trigger via metallization line 20 which is connected to underpass resistor R2 similar in structure to resistor R1 through contact 21. Resistor R2 is connected to metallization line 22 which in turn is connected to transistor T2 through contacts 23. Transistor T2 in the upper A.C. trigger circuit is the functional equivalent of transistor T1 in the lower circuit. The structure of transistor T2 may be better seen in the enlarged view of the upper A.C. trigger in FIG. 2A. It comprises N collector region 24, P base region 25 and N+ emitter region 26.

Referring once again to FIGS. 1 and 2A, the +V voltage supply applied via land 27 on the module is connected to external pad 28 on the chip as well as to pads 29 and 30. The +V voltage supply applied to these three pads is distributed to both the upper and lower A.C. trigger circuits. For example, the +V from pad 28 is connected by metallization segment 31 to resistor R3 connected to line 32 which is applied to the collector of transistor T2 through contact holes 33. A similar +V voltage level (FIG. 2B) is applied to equivalent transistor T1 in the lower A.C. trigger circuit via metallization line 34 from +V pad 30.

While the $V_{Ref}$ and +V voltage supplies are applied to both the upper and lower A.C. trigger circuits through a common voltage distribution system, one of the voltage supplies, the −V supply may be selectively applied to either the upper or the lower A.C. trigger or both by means of a pair of −V distribution means, i.e. −V distribution metallization patterns which are not connected to each other.

The −V voltage supply is applied to the chip through land pattern 35 on the module surface. Land 35 may be selectively connected to −V distribution pads 36 and 37. If the upper A.C. trigger circuit is to be activated module land 35 is connected to pad 36 by forming module land extension 38. Likewise, if the lower A.C. trigger circuit is to be activated, land extension 39 is formed on the module surface connecting module land 35 to −V pad 37. The elimination of either module land extensions 38 or 39 will respectively eliminate either the upper or the lower A.C. trigger circuit from the chip. In addition, module land 35 connects the —V supply to the common P+ isolation region 45 which is common to both the upper and lower A.C. trigger circuits by means of contact 41 connected to module land extension 42 through pad 55. Thus, the common P+ isolation region has a potential of —V.

In order to better comprehend integrated circuit structure FIG. 1, we will at this time briefly consider the sectional structure of typical devices in the integrated circuit. The cross-section in FIG. 3 taken along lines 3—3 of FIG. 2A is cut so as to illustrate examples of various devices in the chip. The chip comprises a P— substrate 43 and an N epitaxial layer 44 formed on the P— substrate. P+ isolation regions 45 extend through epitaxial layer 44 to substrate 43, to form together with substrate 43, P type isolation pockets. This P type isolation, as well as the epitaxial layer 44, are regions common to both the upper and lower A.C. trigger circuits. Transistor T3 is a typical transistor. It contains a buried N+ subcollector region 46, and an N collector region 47 which is actually a portion of epitaxial layer 44, a P base region 48 and an N+ emitter region 49.

Returning now to the description of the —V voltage supply distribution system, with reference to FIGS. 1 and 2A and 2B, each of the two A.C. trigger circuits has a separate —V voltage distribution system. Metallization bus bar 50 connected to pad 36 effects the distribution of the —V supply to the upper A.C. trigger circuit while peripheral bus bar 51 connected to pad 37 distributes the —V supply to the lower A.C. trigger circuit. A resistor array of 20 resistors, typified by resistors R10, R11, R12, R13, R14, and R15, disposed around the periphery of the chip provides the means by which the —V voltage supply carried along bus bars 50 and 51 may be distributed to interior portions of the chip. This resistor array provides paths of fixed resistance from these peripheral —V bus bars crossing under surface metallization having different voltage levels.

The structure of such a resistor is illustrated in FIGS. 2A and 3, with respect to peripheral resistor R12; it comprises a P type region 52 which acts as the resistance path connected to peripheral bus bar 50 through contact 53. The other end of P type region 52 is connected to —V metallization segment 54 through contact 62. Metallization segment 54 is connected to the emitter of transistor T3 and provides a —V voltage level thereto. In this fashion, resistor R12 provides an underpass or cross-under for the —V voltage supply.

It should be noted that in general none of the chip pads, e.g. pads 36, 37, 21, or 30, makes direct contact to the semiconductor substrate immediately beneath the pad. Rather, the pads are connected to metallization such as bus bars 50 and 51 or metallization segment 31 which in turn are connected to the contacts with regions in the substrates. Pad 55 is an exception. Module land extension 42, which applies the —V supply to the P+ isolation region in the substrate, contacts pad 55 which in turn applies the —V voltage supply to the P+ isolation region through contact 41.

Since the —V voltage supply is the only supply that may be independently applied to either of the two A.C. trigger circuits, the application of this —V supply to either of the two A.C. triggers or both will determine which A.C. trigger circuit is rendered operable. As previously mentioned, if standard functional testing indicates that one of the two A.C. triggers contains defects which will render it non-functional, the —V voltage supply from land 35 on the module will be applied only to the —V pad (36 or 37) of the good A.C. trigger circuit. For example, suppose the lower A.C. trigger circuit fails to pass the functionality test, then module land extension 39 (FIGS. 1 and 2B) is not formed and pad 37 remains unconnected to the —V voltage supply. On the other hand, pad 36 is connected to the —V voltage supply through land extension 38. Therefore, the lower A.C. trigger circuit lacks the —V voltage supply necessary to render it operable, and it should remain inoperative during the operation of the A.C. trigger in the upper half of the chip. The defective lower A.C. trigger should not interfere with the normal operation of the upper A.C. trigger provided that peripheral bus bar 51 of the lower A.C. trigger circuit remains free of the —V voltage supply. However, since the P+ isolation region 45 is common to both halves of the chip, there is a danger of bus bar 51 or other metallization in the —V distribution system in the lower or bad A.C. trigger becoming short-circuited to underlying P+ isolation region 45. This danger becomes even more significant because bus bar 51 runs along the edge of the chip as does P+ isolation region 45.

With reference to FIG. 3, it will be noted that there is a distinct possibility that an edge defect, such as a dent or crease can break insulation layer 56 along the edge of the chip and thereby short P+ isolation region to the overlying bus bar in the —V distribution metallization. Such a short would apply the —V voltage level of the P+ region 45 to bus bar 51 thereby rendering the bad lower A.C. trigger circuit operative. This, in turn, would probably render the good upper A.C. trigger circuit ineffective by interconnecting it with the bad lower A.C. trigger circuit.

It is therefore critical to the practice of the testing method of the present invention to have a test procedure whereby shorts between the common P+ region and the —V distribution metallization in the bad A.C. trigger circuit can be detected.

Considering now the test procedure to which the chip of FIG. 1 is subjected, conventional performance tests are carried out on the upper A.C. trigger circuit and the lower A.C. trigger circuit. Such standard performance tests are well-known in the art and are described, for example, in the text, "Integrated Circuit Engineering Basic Technology," edited by the Integrated Circuit Engineering Corporation, Phoenix, Arizona, Glen R. Madland et al., Boston Technical Publishers, Inc., 1966, 4th Ed., pps, 134–138. Such basic performance tests determine the ability of each of the two trigger circuits to fulfill the basic function for which they were designed. The test specification relates to the intended application of each of the circuits. The standard performance tests are made on each of the two circuits as if it were a single integrated circuit using "black box" techniques. These tests include sweeping the input of the circuit at selected pads and observing the output at other pads to determine switching thresholds and saturation levels, the effects of size and speed of the input signals is also determined. The circuits are also treated for the size of the load which the circuit is capable of driving. In addition turn-on, turn-off and delay time is measured as well as noise immunity of the circuit.

If the circuit passes such functional tests by displaying specified predetermined characteristics necessary for the particular application to which the circuit is to be put, the circuit is classified as a good circuit. If, on the other hand, the circuit fails to meet such specifications, it is classified as a bad circuit. In the present structure, where both the upper and lower trigger circuits pass the functionality tests and are classified as good circuits, there is no problem. Such chips are ultimately mounted on the module lands with both pad 36 contacting land extension 38 and pad 37 contacting module land extension 39 from the −V voltage supply module land 35.

If one of the circuits does not pass and is classified as a bad circuit, this circuit must be subjected to the following additional test which determines whether there are any short-circuits from the −V distribution metallization on such bad circuit and the common P+ isolation in the bad circuit. For the purpose of this test, let us assume that the upper trigger circuit is classified as a bad circuit in the functional test and the lower trigger circuit is classified as good. In such a case, a voltage of the −V level is applied to pad 37 (FIGS. 1 and 2A) in the good circuit and pad 36 in the bad circuit is maintained at ground potential. At the same time a potential of −V is applied to pad 55 which places P+ common isolation region 45 at a potential of −V. The voltage difference between pad 36 and pad 57 is then measured. Pad 57 is connected to pad 36 through metallization segment 58 connected to resistor R10 which is in turn connected to pad 57 through metallization segment 59. If there are no significant short-circuits, the voltage between pads 36 and pads 57 should be negligible since pad 57 is substantially at a level of 0 volts. However, if there is a significant short, then the negative voltage level of bus bar 50 and consequently, pad 36 should increase. This will cause a current to flow through resistor R10 creating a voltage difference between pads 36 and 57. When this voltage difference exceeds a predetermined level, which provides the necessary tolerances for stray current effects, such a result indicates that a significant short circuit exists. For example, where −V is 4.46 volts and pads 36 and 57 should be substantially at 0 volts. A negative voltage difference between pads 36 and 57 exceeding 0.1 volts is considered to be indicative of a significant short-circuit and the whole chip is discarded as inoperative.

In the case where the lower circuit is found to be bad, and the upper circuit good, the test is similarly performed by applying a potential of −V to pads 36 and 55 and a ground potential to pad 37 (FIGS. 1 & 2B). Then the voltage difference between pads 37 and 60 is measured. Pad 37 is connected to pad 60 via bus bar 51 connected to resistor R15 connected to metallization segment 61 which is in turn connected to pad 60. Here again, if the voltage difference between pads 37 and 60 exceeds a predetermined level as described above, the result indicates a significant short-circuit whereby the bad A.C. trigger circuit will affect the good circuit and the entire chip is discarded.

Where the voltage difference between the two pads of the test does not exceed the predetermined level, the results indicate that there are no significant shorts in the bad circuit which will affect the good circuit and only the good circuit is utilized when the chip is mounted on the module substrate by selectively connecting the −V potential by means of the appropriate module lands to only the good circuit.

While the present has hs been illustrated utilizing a chip containing a pair of A.C. trigger circuits, it should be clear that the principles of the present invention apply to any chip structures having a plurality of separable circuits which are intended to perform any of a variety of functions. In all of these situations, the testing method will determine whether there are any significant short-circuits which inadvertently apply the voltage supply necessary to selectively render a separable circuit operative to the bad circuits.

While the invention has been particularly shown and described with reference to a preferred embodiment thereof, it will be understood by those skilled in the art that various changes in form and detail may be made therein without departing from the spirit and scope of the invention.

What is claimed is:

1. An integrated circuit structure comprising
   a plurality of separable circuits, at least one of said separable circuits being functional and at least one of said separable circuits being defective, each of said separable circuits comprising an interconnected plurality of regions of different conductivity types, and each of said separable circuits requiring the application of two voltage levels in order to be operable,
   at least one voltage supply for applying one of said voltage levels connected to all of said separable circuits by interconnections common to all of said separable circuits,
   an additional voltage supply providing the other of said voltage levels,
   receiving and distributing means in each of said separable circuits for receiving and distributing said other voltage level, said receiving and distributing means in each circuit being independent of each other,
   connecting means connecting said additional voltage supply to said receiving and distributing means of only the functional separable circuits to thereby provide said other voltage level required in order for said functional separable circuits to be operable, and
   at least one common region of one-type conductivity extending between all of said separable circuits and connected to said additional voltage supply,
   said receiving and distributing means in each of said defective separable circuits not connected to said additional voltage supply being free of short-circuits to said common region, and thereby completely electrically isolated from said common region.

2. The chip structure of claim 1 wherein said common region connected to said additional voltage supply is an isolation region extending along the edge of the chip.

3. The chip structure of claim 2 wherein the independent receiving and distributing means in each circuit includes a metallization pattern extending along the edge of the chip.

4. An integrated circuit module package comprising
   a chip structure comprising
     a plurality of separable circuits, at least one of said separable circuits being functional and at least one of said separable circuits being defective, each of said separable circuits comprising an interconnected plurality of regions of different conductivity types, and each of said separable circuits requiring the application of two voltage levels in order to be operable,
     at least one voltage supply for applying one of said voltage levels connected to all of said separable circuits by interconnections common to all of said separable circuits, an additional voltage supply providing the other of said voltage levels, receiving and distributing means in each of said separable circuits for receiving and distributing said other voltage level, said receiving and distributing means in each circuit being independent of each other, connecting means connecting said additional voltage supply to said receiving and distributing means of only the functional separable circuits to thereby provide said other voltage level required in order for said functional separable circuits to be operable, and at least one common region of one-type conductivity extending between all of said separable circuits and connected to said additional voltage supply, said receiving and distributing means in each of said defective separable circuits not connected to said additional voltage supply being free of short-circuits to said common region, and thereby completely electrically isolated from said common region, and a dielectric substrate supporting said chip comprising
a conductive land pattern on a surface thereof, and
a plurality of pins for module connection penetrating said substrate and connected to said land pattern,
one of said pins being connected to a voltage source providing said additional voltage supply, and said connecting means connecting said additional voltage supply to functional circuits comprises a portion of said conductive land pattern connecting said voltage pin to the means for receiving the additional voltage supply in the functional separable circuits.

* * * * *